(12) United States Patent
Brissot

(10) Patent No.: US 7,561,197 B2
(45) Date of Patent: Jul. 14, 2009

(54) MATRIX IMAGE RECORDER WITH IMAGE SENSOR AND A PLURALITY OF ROW CONDUCTORS

(75) Inventor: Louis Brissot, Saint Egreve (FR)

(73) Assignee: Atmel Grenoble (FR)

( * ) Notice: Subject to any disclaimer, the term of this patent is extended or adjusted under 35 U.S.C. 154(b) by 571 days.

(21) Appl. No.: 10/557,670

(22) PCT Filed: Apr. 22, 2004

(86) PCT No.: PCT/EP2004/050587

§ 371 (c)(1),
(2), (4) Date: Nov. 22, 2005

(87) PCT Pub. No.: WO2004/105136

PCT Pub. Date: Dec. 2, 2004

(65) Prior Publication Data

US 2007/0052829 A1    Mar. 8, 2007

(30) Foreign Application Priority Data

May 23, 2003    (FR)    .................... 03 06202

(51) Int. Cl.
*H04N 3/14* (2006.01)
*H04N 5/335* (2006.01)
(52) U.S. Cl. ............... 348/308; 348/310; 250/208.1
(58) Field of Classification Search .............. None
See application file for complete search history.

(56) References Cited

U.S. PATENT DOCUMENTS

| | | | |
|---|---|---|---|
| 6,317,154 B2 * | 11/2001 | Beiley | 348/308 |
| 6,365,950 B1 * | 4/2002 | Sohn | 257/431 |
| 6,410,901 B1 * | 6/2002 | Lee et al. | 250/208.1 |
| 6,501,064 B2 * | 12/2002 | Kole | 250/208.1 |
| 6,555,805 B2 * | 4/2003 | Afghahi | 250/208.1 |
| 6,556,244 B1 * | 4/2003 | So et al. | 348/296 |
| 6,566,697 B1 * | 5/2003 | Fox et al. | 257/292 |
| 6,847,070 B2 * | 1/2005 | Fox | 257/291 |
| 6,876,388 B1 * | 4/2005 | Lee et al. | 348/305 |
| 6,940,551 B2 * | 9/2005 | Merrill | 348/301 |
| 6,975,356 B1 * | 12/2005 | Miyamoto | 348/308 |
| 7,045,753 B1 * | 5/2006 | Fox | 250/208.1 |
| 7,259,790 B2 * | 8/2007 | Mabuchi et al. | 348/310 |
| 7,349,018 B2 * | 3/2008 | Doering et al. | 348/308 |

(Continued)

FOREIGN PATENT DOCUMENTS

EP    0 492 597 A    7/1992

(Continued)

*Primary Examiner*—Ngoc-Yen T Vu
(74) *Attorney, Agent, or Firm*—Lowe Hauptman Ham & Berner, LLP

(57) ABSTRACT

The invention relates to matrix image sensors intended in particular for digital photography. The invention provides a driver in each pixel that allows exposure control common to the entire matrix. The driver comprises five transistors, a photodiode and, apart from a supply conductor and a ground, four control conductors, these being an exposure control conductor common to all the pixels of the matrix; a row selection conductor common to all the pixels of any one row; a reset conductor common to all the pixels of any one row; and a column conductor for collecting the signal read on the pixels during row-by-row reading of the charges photogenerated in the pixels of the matrix.

20 Claims, 4 Drawing Sheets

U.S. PATENT DOCUMENTS

2001/0010353 A1 * 8/2001 Merrill et al. ............ 250/208.1
2003/0218680 A1 * 11/2003 Shiohara .................... 348/308

FOREIGN PATENT DOCUMENTS

| EP | 0492597 | 7/1992 |
| EP | 0 718 889 A | 6/1996 |
| EP | 0718889 | 6/1996 |
| EP | 1 187 217 A | 3/2002 |
| EP | 1187217 | 3/2002 |
| EP | 1 195 986 A | 4/2002 |
| EP | 1 223 623 A | 7/2002 |
| EP | 1223623 | 7/2002 |
| EP | 1 310 999 A | 5/2003 |
| EP | 1310999 | 5/2003 |

* cited by examiner

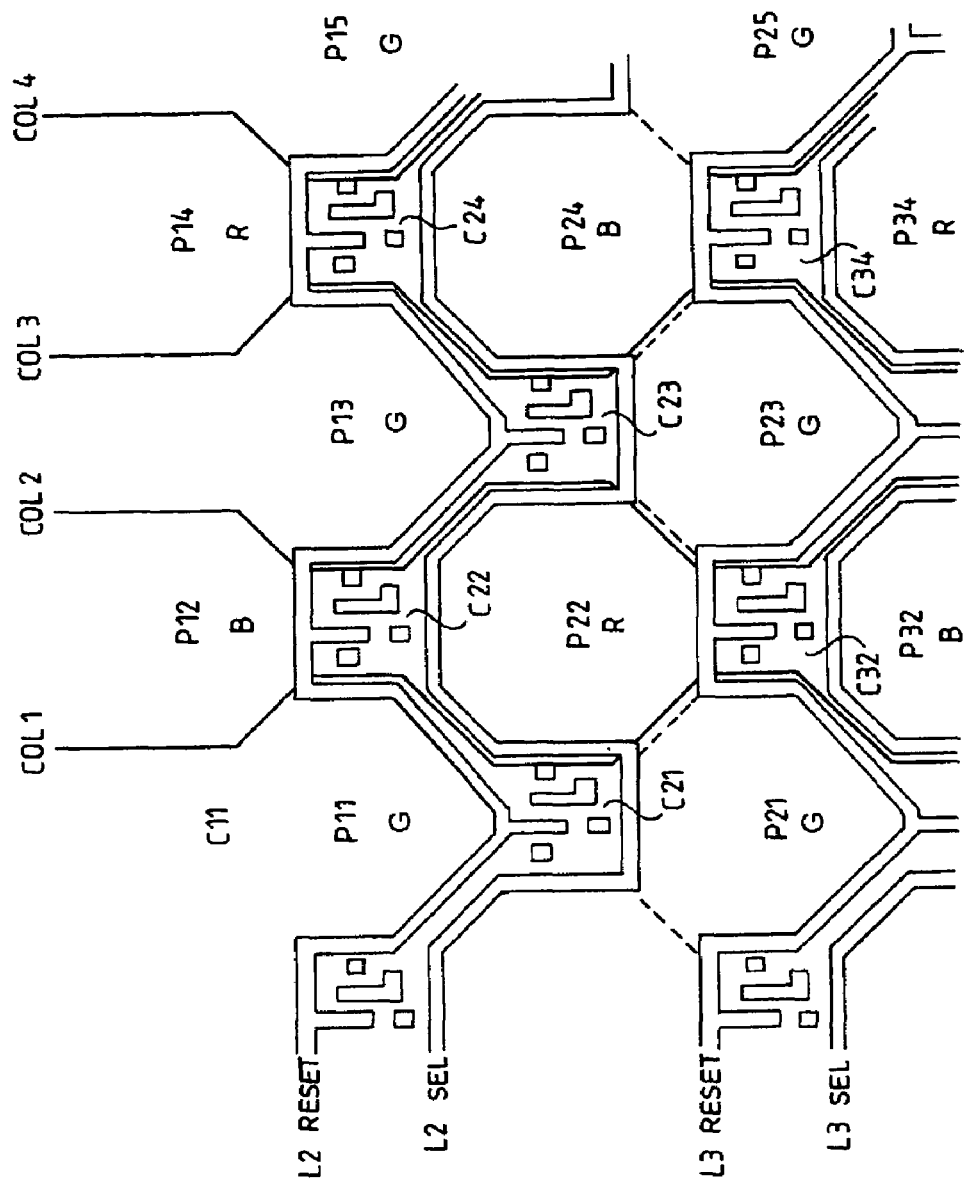

MATRIX IMAGE RECORDER WITH IMAGE SENSOR AND A PLURALITY OF ROW CONDUCTORS

FIELD OF THE INVENTION

The invention relates to matrix image sensors intended in particular for digital photography.

BACKGROUND OF THE INVENTION

One conventional technology uses CCD (charge coupled device) sensors, but it is apparent that a CMOS technology could also be used, this having the advantage of allowing both the actual image sensor, that is to say a matrix of photosensitive elements, and complex electronic image processing circuits to be produced on the same silicon integrated circuit chip. This CMOS technology also has the advantage of consuming less energy. However, it has the drawback of not allowing easy separation between acquisition of an image and reading of this image.

Typically, it would be desirable overall to acquire the entire image over an exposure time which not only is the same for all the picture elements (or pixels) but which starts at the same instant for all the elements and terminates at the same instant, before passing to an operation to read the electronic charges generated at each element by this exposure.

This is possible only if, at each pixel there is a means for storing the charges accumulated at this pixel, means for limiting the exposure time, that is to say the time to acquire the charges for all the pixels of the matrix, and there is a means for subsequently transferring, pixel by pixel, the charges stored in the pixel to the outputs of the matrix. These components were available in CCD technology and comprised the same number of storage regions as photodetection regions, these being located in a matrix contiguous with the photodetection region (frame transfer organization) or else located within each pixel (interline organization). However, in CMOS technology it is necessary to use several transistors in each pixel. These transistors, their connections and the row and column conductors allowing them to operate reduce the available space for producing an actual photosensitive region. As a result, there is reduced sensitivity for a given pixel size. Alternatively, at a given sensitivity the result is an increased pixel size and therefore an increase in the size of the chip and of the associated optical objectives, which is expensive, or else the result is a reduction in the number of pixels and therefore in the resolution of the sensor if the size of the chip is maintained.

SUMMARY OF THE INVENTION

The object of the invention is to provide an improved pixel structure for a sensor in CMOS technology, allowing a good compromise between these various parameters (sensor size, resolution, sensitivity), while still allowing exposure time control and simultaneous exposure of all the pixels of the sensor before the image captured by the set of pixels is read.

The subject of the invention is an image sensor comprising a matrix of photosensitive elements, with, in the region where each row and each column of the matrix cross, a pixel having:
- a photosensitive region of n-type conductivity, capable of storing photosensitive charges for an exposure time;
- an n-type storage region capable of receiving and temporarily storing the charges from the photosensitive region;
- a first transfer gate controlled by an electrode for authorizing the transfer of charges from the photosensitive region to the storage region;
- a second transfer gate for authorizing the transfer of charges from the photosensitive region to a supply conductor common to the entire matrix;
- a third transfer gate for authorizing the transfer of charges between the storage region and the supply conductor;
- a first follower MOS transistor having its drain connected to the supply conductor, and its gate formed by a fourth transfer gate, this gate being connected to the storage region in such a way that the potential of the source for the first MOS transistor, when this transistor is conducting a current, follows the variations in the potential of the storage region;
- a second MOS transistor for authorizing the current conduction in the first MOS transistor, the drain of the second transistor being connected to the source of the first, the source of the second transistor being connected to a column conductor common to all the pixels of any one column, and the second transistor having a gate formed by a fifth transfer gate, the sensor further including a first row conductor, or row selection conductor, connected to the second and fifth transfer gates of all of the pixels of any one row, a second row conductor, or reset conductor, connected to the third transfer gate of all the pixels of any one row, and a third conductor or transfer or exposure-control conductor, connected to the first transfer gate of all the pixels of the matrix.

The structure of each pixel of the matrix is therefore a structure comprising five transfer gates and one photosensitive region, thereby constituting a relatively complex circuit at the intersection between each row and each column, but the configuration according to the invention is such that the pixels are connected to the peripheral drivers only via four conductors (apart from the supply and ground) which are the following: two row conductors (one for selection and one for resetting each new acquisition); one column conductor for reading the image acquired; and a conductor common to all the pixels for controlling the exposure time. This number is particularly small taking into account the complexity of the operation of an image sensor in CMOS technology, and the production constraints may be minimized.

The first, second and third transfer gates are preferably transfer gates overhanging semiconductor regions in which the doping is such that the threshold voltage for authorizing the flow of charges into these regions is practically zero. It will be recalled that a transfer gate located above a p-type semiconductor region permits the current to flow between two n-type regions located on either side of the gate, namely a source region and a drain region, when the voltage between the gate and the source region exceeds a specified threshold VT that depends on the distance between the gate and the substrate and depends on the doping in the p-type region. By varying this distance and the doping to a greater or lesser extent in the overhanging semiconductor region, it is possible to adjust, at will, this threshold and in particular to lower it to a value close to zero. One method consists in particular in partially compensating for the doping in the p-region by locally adding impurities of n-type conductivity in the substrate beneath these three gates. Another method consists in choosing appropriate doping of the substrate, which corresponds to a zero threshold voltage or a threshold voltage that is very close to zero.

Preferably, the first and second MOS transistors are conventional n-channel transistors, having a non zero threshold voltage (for example around 0.5 volts, the supply voltage Vdd being 2.5 volts) and they are formed in a p-type well formed on the surface of the semiconductor substrate in which the sensor is formed. In contrast, the first, second and third transfer gates directly overhang semiconductor substrate regions that are locally doped according to the desired threshold voltages, but they do not overhang regions formed in a well.

The photosensitive region is preferably formed by an n-type doped region lying beneath a grounded p-type shallow region.

Preferably, the matrix of pixels is organized in a staggered fashion, that is say, assuming that the rows of the matrix are horizontal and the columns are vertical, a row control register being located on a vertical edge of the matrix and the circuits for collecting the charges at the end of the column being located on a horizontal edge of the matrix, whereas the directions along which the center of the photosensitive regions lie closest together are the diagonal lines of the matrix. The transfer gates and transistors constituting the control electronics for the pixel associated with a photosensitive region are preferably combined in a control region located in one corner of the photosensitive region (that is to say neither at the center nor distributed around the entire perimeter), and the directions along which the centers of the control regions are closest together are located along diagonals of the matrix.

BRIEF DESCRIPTION OF DRAWINGS

Other features and advantages of the invention will become apparent on reading the detailed description that follows and with reference to the appended drawings in which:

FIG. 7 shows a general view of color image acquisition matrix.

DESCRIPTION OF PREFERRED
EMBODIMENTS

The matrix image sensor is formed on a semiconductor substrate of p-type conductivity, into which n-type or p-type impurities are locally diffused so as to form p-type regions and n-type regions of variable doping levels. The symbol $n^+$ or $p^+$ will be used to denote n-type or p-type regions that are quite highly doped, and therefore quite highly conducting. The symbol $p^-$ will be used to denote lightly doped p-type substrate regions. The bulk of the substrate in which the sensor is formed is of the $p^-$-type.

Figure 1:
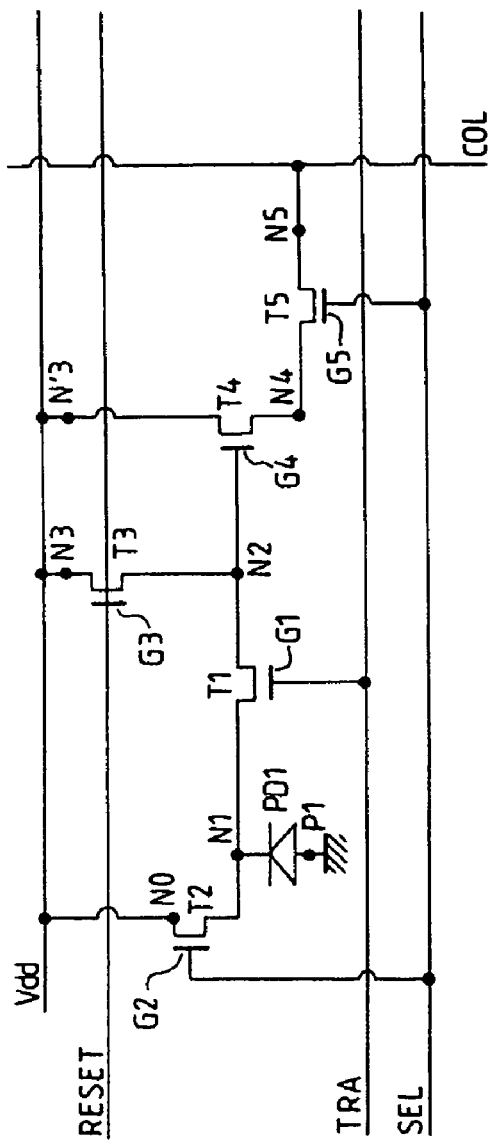
FIG. 1 shows the circuit diagram of the control electronics for a pixel of the matrix.
Figure 2:
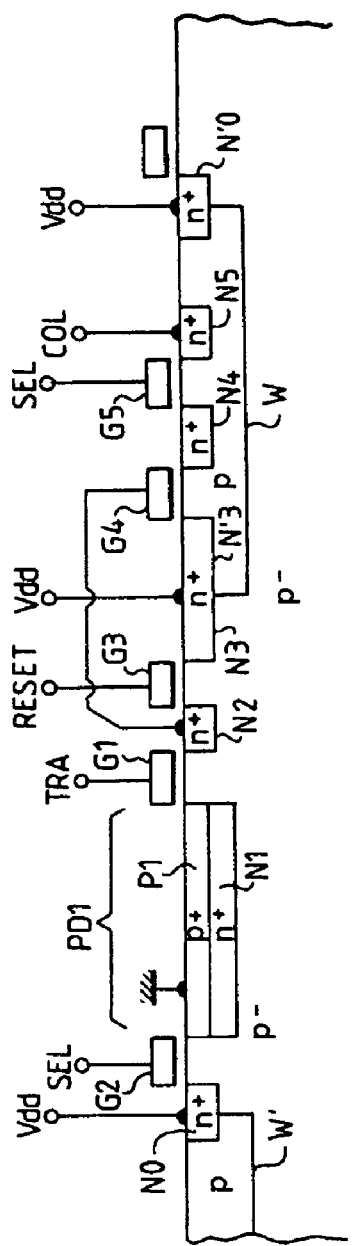
FIG. 2 shows a cross section through the semiconductor substrate carrying the matrix, the cross section being made so that it is possible to see in it all the useful semiconductor regions of the pixel.

The pixel shown in FIGS. 1 and 2 comprises a photosensitive element which in this example is a photosensitive diode formed by the junction between a $p^+$-type region P1 and an $n^+$-type region N1. Preferably, the region P1 is formed on the surface of the substrate and is grounded (at zero supply voltage), the $p^-$-type substrate also being grounded via a $p^+$-type diffusion (not shown). The region N1 is located here entirely below the region P1. The photosensitive region will be called the region N1. It is in the region N1 that the negative charges resulting from illumination of the pixel are collected, because this region remains at potential above that of the region P1.

Shown symbolically in FIG. 1 are two transistors T1 and T2 for the control elements adjacent to the photosensitive region N1, these allowing charges to be transferred to this photosensitive region or from this photosensitive region. In fact, as may be seen in FIG. 2, these are not transistors in the sense that they would have an autonomous drain, source and gate, since the source of these transistors is not autonomous but consists of the region N1 itself. These control elements T1 and T2 are therefore essentially charge transfer means comprising a transfer gate (gate G1 for transistor T1, gate G2 for transistor T2) above a channel that separates the region N1 from the drain regions.

The first transfer gate G1 allows charges to be transferred from the photosensitive region N1 to an $n^+$-doped drain region N2, called the storage region, on the surface of the substrate. This gate G1 allows this transfer to take place after a specified exposure time.

The second transfer gate G2 allows charges to be transferred from the photosensitive region N1 to an $n^+$-type drain region N0, which is connected to a general supply conductor Vdd. This transfer takes place, as will be seen later, for resetting the potential of the photosensitive region. The fixed potential of the supply conductor Vdd may for example be 2.5 volts.

A third transfer gate G3 allows charges to be transferred from the storage region N2 to an $n^+$-type drain region N3 connected to the supply conductor Vdd. This gate G3 is used to reset the potential of the storage region N2. This gate, being placed above the substrate between two $n^+$-type diffusions, establishes an actual MOS transistor.

Two transistors T4 and T5, each having a source, a drain and a gate, are formed in a p-type well W formed on the surface of the $p^-$ substrate and more highly doped than the substrate. Since the well is more highly doped than the rest of the substrate, the threshold voltages of the transistors T4 and T5 are a priori higher than the threshold voltages of transistors formed directly in the $p^-$ substrate. FIG. 2 shows the p-type well W on the right, while the well W' on the left of the figure corresponds to an adjacent pixel to the left of the pixel in question.

The transistor T4 has its gate G4 connected to the storage region N2 via a metal or polysilicon conductor. It drain is formed by an $n^+$-type region N'3, located in the well W, and which is connected to the supply conductor Vdd. The region N'3 may be formed by an extension of the region N3 (lying outside the well W) right into the well W. The source of the transistor T4 is formed by an $n^+$-type region N4 located in the well W.

The transistor T4 is a follower transistor in the sense that its source follows the potential of this gate (to within an offset, which is the gate-source threshold voltage of the transistor), at the very least when current conduction is permitted in this transistor, and it will be seen that it is only during the phase of reading the charges on the row of pixels that this conduction is possible.

To read charges on a row of pixels, the transistor T5, in series with the transistor T4, is turned on to allow the transistor T4 to conduct. The transistor T5 has its drain formed by the same region N4 and the source of the transistor T4. It has a transfer gate G5 connected to a row selection conductor SEL common to all the pixels of any one row and it has its source formed by an $n^+$-type region N5 connected to a column conductor COL common to all the pixels of any one column.

Figure 3:
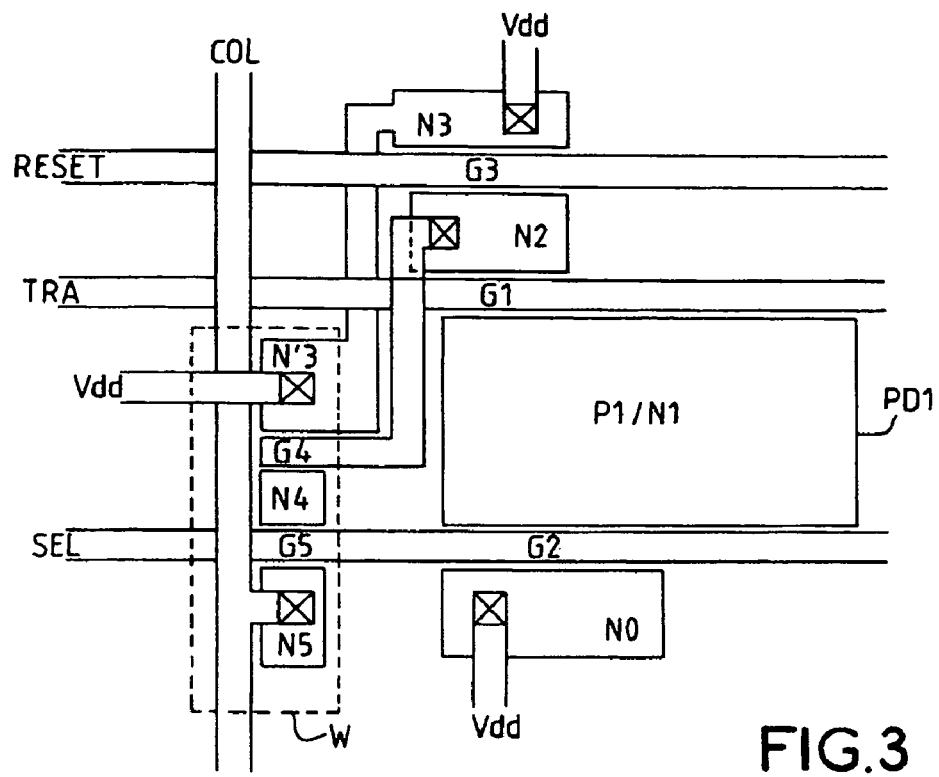
FIG. 3 is, seen from above, a view showing the principle of the pixel formed on a semiconductor substrate.

FIG. 3 is, seen from above, a view showing the principle of the various n-type impurity diffusions on the surface of the substrate and the transfer gates that overhang p-type or p⁻-type regions separating two n⁺-type regions. The dimensions and the geographical positions of the regions have been given merely by way of example, and in one specific embodiment the aim will be to minimize the footprint of all of the transfer gates and their connections in order to leave as much of the surface free as possible, not covered with gates or connections, above the photodiode PD1.

As mentioned, the photodiode PD1 is formed by a grounded p⁺-type region P1 covering an n⁺-type region N1.

The transfer gates G1 to G5 will be made of polysilicon according to the MOS technology generally in use. This polysilicon may be connected to metal conductors or may be coated with metal conductors, or else it may be connected to n⁺-type diffused semiconductor regions, depending on the case. For example, to connect all the gates G2 of the pixels of a row to one and the same row conductor SEL, it will be possible:

- either for the row conductor to be made, over its entire length, from polysilicon;
- or for the row conductor to be made, over its entire length, from polysilicon coated with a more conductive metal (aluminum, tantalum, etc.) with which it is regularly in contact;
- or for the row conductor to be a metallic line (aluminum or second polysilicon level) that contacts a polysilicon gate G2 of the first level formed only locally in the pixel between the photodiode PD1 and the region N0.

The column conductors may be formed by a metal (aluminum), while the supply conductor may be formed by an upper metal level.

In FIG. 3, which is a figure showing the principle of the arrangement, in order to simplify matters the conductor SEL is considered as being over its entire length a polysilicon line.

The same comment as regards the production of the gates may be made in respect of the gates G5 (connected to the same row selection conductor SEL) and in respect of the gates G3 connected to the conductor RESET that connects all the gates G3 of any one row. The same comment may also be made in respect of the gates G1, except that the gate G1 is connected to a conductor common to the entire matrix and not only to the row of pixels, as is the case for the gates G2, G5 and G3.

The regions N5 of all the pixels of any one column are connected to one and the same column conductor COL. This conductor is shown as being placed beside the region N5, but the conductor may very well pass over the region N5 and come into contact only locally with this region.

The region N2 is locally connected, within the pixel, to the gate G4 of the same pixel, but it is not connected to the adjacent pixels. The connection may be made via a metal conductor that connects the region N2 and the gate G4. However, since the gate G4 is made of polysilicon, the connection may be made by an extension of the polysilicon going up to the region N2 and in direct ohmic contact with this region.

The regions N0, N3, N'3 are connected to metal conductors raised to Vdd and distributed over the entire matrix. These conductors may come down in places onto the silicon of the regions N0, N3, N'3 and establish local ohmic contact with these regions.

Figure 4:
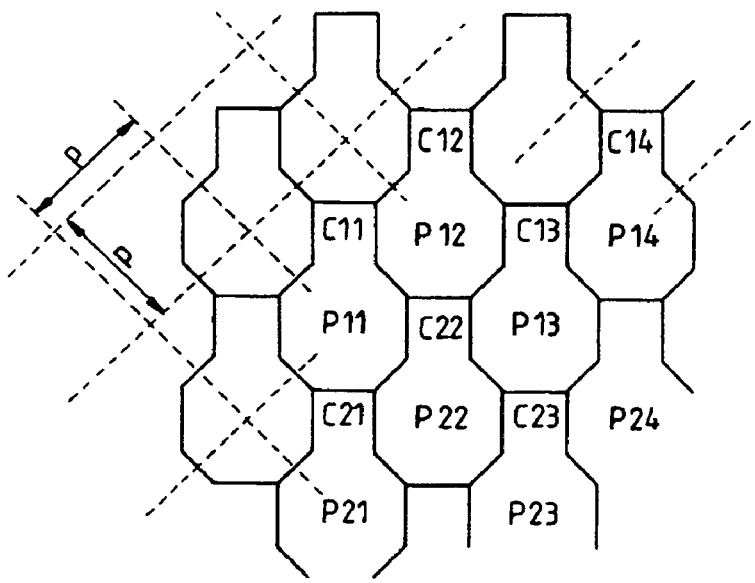
FIG. 4 shows a general view of the staggered organization of the pixels of the matrix.

In FIG. 3, the SEL and RESET row conductors and the common conductor TRA are shown as straight lines, as is the common conductor COL, but they are not necessarily straight lines, as will be seen with regard to FIG. 4 et seq.

The pixel that has just been described, at the intersection of a row of pixels with a column of pixels of the matrix array, has only the following control conductors, apart from a general supply and a ground: a column conductor, two row conductors SEL and RESET and a general conductor TRA that controls the end of exposure. The start of exposure is provided by a pulse applied simultaneously to all the gates G2. This number of conductors is relatively modest, although it does allow the exposure time to be controlled for all the pixels of the matrix at the same time, unlike in systems in which the pixels are exposed in succession, row by row.

The matrix operates in the following manner for acquisition of an image and reading of this image:

a. initial state:
  at the start, before the time t0 corresponding to the start of a new picture taken, all the row conductors RESET, which have a reset control function, have been set to the potential Vdd. The channels beneath the transfer gates G3 are open for all the pixels of the matrix. As a result, all the storage regions N2 are at the potential Vdd and the row selection conductors SEL are grounded and the channels beneath the gates G2 are closed. The transfer conductor TRA is at ground potential;

b. triggering of the exposure:
  at time t0, a pulse for triggering a new picture is applied by the conductors SEL to all the gates G2 of the matrix. The pulse is a short pulse at the potential level Vdd, from a time t0 to a time t'0. The channel beneath the gate G2 opens and empties all the charges from the photosensitive region N1 for all the pixels of the matrix. The pulse is short compared with the exposure time—it lasts for example one microsecond—the duration being, however, sufficient for the region N1 to be emptied of all the charges and for it to pass to the reference potential of the fully depleted photodiode. After this pulse has disappeared, by the potential of the gates G2 returning to 0, the channels beneath the transfer gates G2 are closed and the channels beneath the gates G1 are also closed. The photosensitive regions N1 therefore contain no electrons. The row reset conductors RESET are, immediately after the end of the pulse to the conductor TRA, brought back to the ground potential, closing the channels beneath the gates G3 of the entire matrix. The storage regions N2 are then isolated and charged to the potential Vdd;

c. exposure:
  after time t'0, the photosensitive regions collect and store, for all the pixels of the image, the charges photogenerated by the exposure to light. The potential of the photosensitive region drops in proportion to the illumination received on the pixel over the duration of the exposure chosen;

d. end of exposure:
  the duration of exposure started at t'0 ends at a time t1 when a new short pulse, which is now an end-of-exposure pulse, is applied simultaneously to the entire matrix via the conductor TRA. The pulse is at the potential Vdd for a short period (for example one microsecond) but this is sufficient to empty the charges on the photosensitive region in the storage region. There is only a single exposure time for the entire matrix, and this is controlled by a peripheral circuit for the sensor, which controls the conductor TRA. By opening the channel beneath the transfer gate, the charges accumulated in the photosensitive region flow into the storage region N2 that had previously been emptied of its charges and then isolated. The channel beneath G1 is closed at a time t'1, very close to t1. The potential of the element N2 drops by an amount that is proportional to the charges integrated in the photosensitive region and discharged into the region N2. This drop in potential depends on the capacitance (which is practically fixed) of the region N2. It represents the illumination over the period of exposure;

e. before reading of the matrix;

the storage region N2 is isolated (channel beneath G1 and G3 closed, gate G4 isolated) and its potential remains constant over the entire phase of reading the image that has just been recorded in the regions N2. The reading takes place row by row in order to transfer onto the column conductor COL firstly the potential of the region N2 corresponding to the pixel at the intersection of this column with the first row, and then the potential of the region N2 corresponding to the pixel of the second row, etc. Selection of a row takes place by raising the row conductor SEL to Vdd for the time needed to read this row;

f. reading of a row (phase 1);

when the row in question comes to be read, the conductor SEL of this row is at Vdd and the transistor T5 is turned on. Turning on the transistor T5 allows current conduction in the transistor T4, although no current could flow previously, and the transistor T4 can then behave as a voltage follower and transfer its gate voltage onto its source, to within the offset VT corresponding to the conduction threshold of the transistor T4. The potential of the region N2, reduced by the threshold voltage VT, is therefore transferred onto the column conductor COL, via the transistors T4 and T5. The potential of the column conductor is stored in memory, for example by a sample-and-hold device at the end of the column, awaiting a new potential measurement made immediately afterwards and intended to eliminate, by subtraction, the influence of the threshold voltage on the measurement;

at the same time, the row selection conductor SEL makes the channel beneath the gate G2 conducting, but the elimination of the photocharges that results therefrom is of no importance since these charges no longer contain useful information;

g. reading of a row (phase 2):

before the potential of the row selection conductor SEL is returned to a low value, the row conductor RESET of the same row of pixels is activated, the region N2 passes to the potential Vdd and the potential of the column takes the value Vdd less the threshold voltage VT. This conductor is then grounded, and the potential of the column is then stored by a second sample-and-hold device. By subtracting this measurement from the measurement made in step f, the unknown VT, which may vary from one pixel to another, is eliminated and a precise determination of the potential of the region N2, representing the illumination of the pixel, is obtained;

h. reading of the other rows:

the potential of the row selection conductor SEL is returned to zero, which isolates the column COL from this pixel, and another row is read; and i. resetting, if necessary, after reading the entire image:

when all the rows have been subjected to this double measurement, a new image may be taken, but to do this it is assumed (step a) that all the storage regions N2 are in the high state (Vdd). It is necessary to terminate the procedure after all the rows have been read by a final step i, which consists in bringing, simultaneously or in rapid sequence, all the conductors RESET to Vdd.

The step of transferring charges from the photosensitive region to the storage region must allow complete emptying of the charges, without any residual charge remaining stored in the region N1 as a result of the existence of a potential barrier between a transfer gate and the source of charges that it is desired to transfer. Likewise, application of the voltage Vdd to the storage region N2 must ensure that it is this voltage Vdd, and not the voltage Vdd less a threshold voltage, that is applied to the region N2.

This is why it is preferred to choose the threshold voltages of the gates G1, G2 and G3, but not necessarily those of the gates G4 and G5, to be as close as possible to zero. To do this, on the one hand the gates G1, G2 and G3 are formed above the lightly $p^-$-doped substrate and, on the other hand, depending on the technology parameters (gate insulation thicknesses, $p^-$ doping level), it is possible to slightly compensate for the $p^-$ doping with an n-type impurity (especially phosphorus or arsenic) until the threshold voltage is very close to zero volts.

The preferred organization of the pixel matrix will now be described, taking into account the components that are needed to drive the pixel and taking into account the fact that it is desirable to optimize the image read-speed, resolution and sensitivity characteristics (in order to be able to take several pictures in rapid succession).

FIG. 4 shows the general arrangement of the pixels in the matrix. This arrangement is a staggered arrangement, that is to say if we take a generally horizontal row of pixels, one pixel in two is offset upward or downward relative to the pixels that flank it and that form part of the same row. A pixel denoted by Pij is the pixel corresponding to the intersection of the ith row with the jth column. The pixels P11, P12, P13 and P14 form part of the same, first row.

In this arrangement, assuming that each pixel occupies overall a roughly square area measuring p microns by p microns, shown symbolically by the oblique grid shown in FIG. 4, the spacing of the horizontal rows (i.e. the separation in the vertical direction between two adjacent pixels P12 and P22 belonging to any one column and to two different rows) is $\sqrt{2}p$ and the vertical column spacing (i.e. the separation between two adjacent pixels P11 and P12 belonging to any one row and two different columns is $p/\sqrt{2}$. Along a diagonal, the spacing between adjacent pixels is p. The directions along which the centers of the photosensitive regions are closest together are in fact the diagonals, and the distance between these centers is p.

To maximize the sensitivity, while leaving as large as possible a photosensitive region 3 and not masked by control elements (transfer gates G1 to G5, metal connections, diffused regions other than the photosensitive region), the pixel according to the invention has an octagonal general shape, with a local extension which, in the example shown in FIG. 4, is concentrated against one side of the octagon, for example the top of the octagon. The roughly square extension, denoted by Cij, corresponds to the pixel Pij and contains the elements for controlling this pixel. The lines denoting the perimeter of the octagon are used for passage of row or column conductors as will be explained later.

Figure 5:
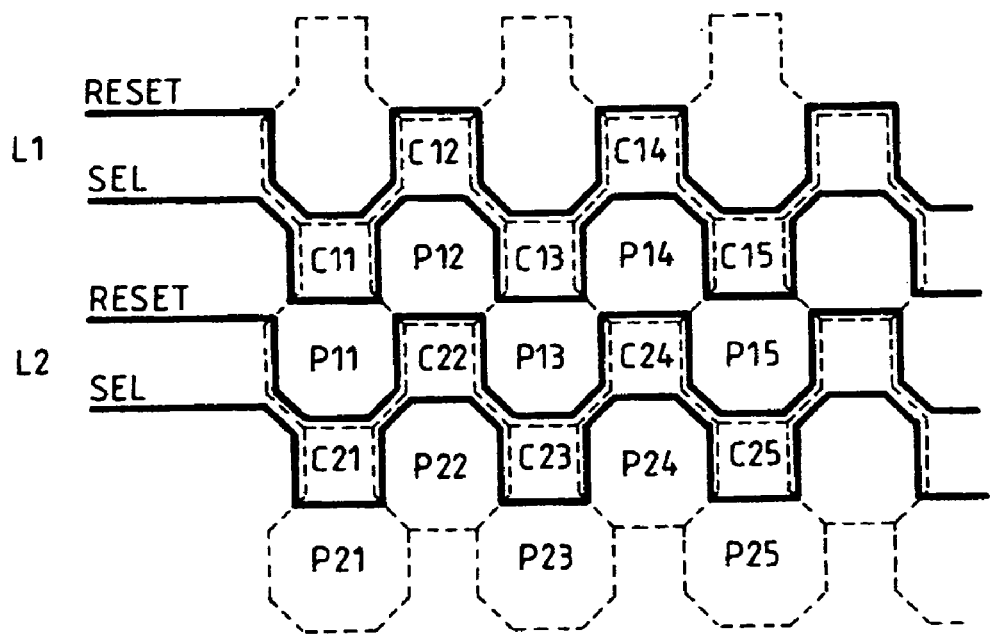
FIG. 5 shows a simplified view of the arrangement of row conductors.

FIG. 5 shows, in a simplified manner, the path of the row conductors connected to the drivers for the pixels in this staggered configuration. A row L1 of staggered pixels, for example P11, P12, P13, P14 and P15, comprises, in order to drive the corresponding pixels, the two row conductors SEL and RESET, and both these conductors follow a broken general line in accordance with the staggered arrangement. More precisely one of the conductors, for example the conductor SEL, passes along the bottom of each square area C11, C12, C13, C14, C15 containing the pixel drivers, and also following an oblique side of the octagonal area of the pixel, whereas the other conductor passes instead via the top of each square area containing the drivers.

Figure 6:
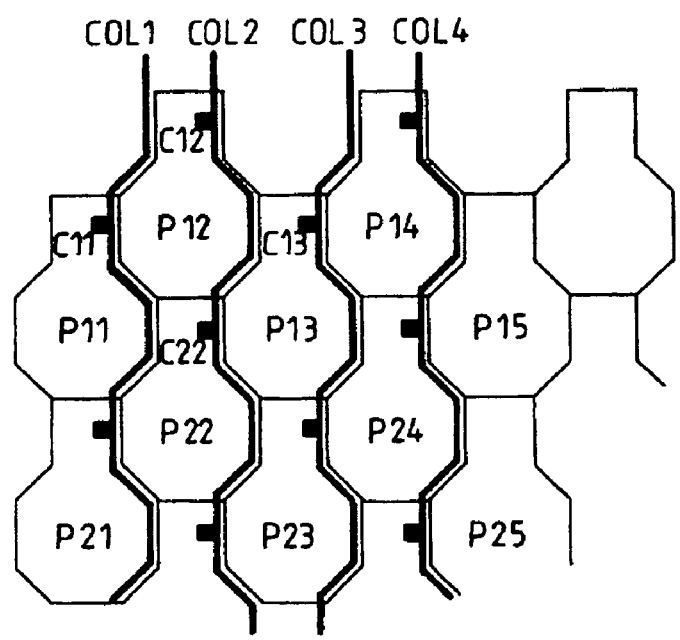
FIG. 6 shows a simplified view of the arrangement of column conductors.

FIG. 6 which, could be superimposed on FIG. 5, but which has been shown separately in order to make the arrangement more intelligible, shows the column conductors COL1, COL2, COL3, COL4 associated with each pixel column. The column conductor COL1 associated with the first column passes along the pixels P11 and P21, following the vertical and oblique edges on one side (on the right) of the orthogonal area and of the square areas C11, C12 that contain the components (the transistor T5, FIGS. 1 to 3) to which this column conductor is electrically connected. The second column conductor COL2 passes likewise to the right of the pixels P12, P22, following their oblique and vertical edges, and it is connected to the transistors T5 contained in the areas C12, C22 associated with these pixels.

FIG. 7 shows the entire organization of staggered pixels, so indicating the organization of the colors for a color matrix. The letters R, G, B associated with each pixel indicate that the corresponding pixel is surmounted by a red, green or blue color filter, respectively. The staggered geometrical arrangement is particularly favorable for an interpolation calculation making it possible, knowing the luminance levels of the primary colors detected in each pixel according to the filter that covers this pixel, to reconstruct a composite color for each of these pixels. Thus, the red pixel P22 may be considered as a spot illuminated by a color combination corresponding to the red level received at this point P22, to a green level, which is half the sum of the green luminance levels received on the pixels P11 and P23 that are symmetrical with respect to the pixel P22 or one quarter of the sum of the luminance levels received on the four symmetrical pixels P11, P23, P13 and P21, and to a blue level which is half the sum of the blue colors received on the pixels P12 and P32 that are symmetrical with respect to the pixel P22. Likewise, a green pixel P23 may be considered, by interpolation, as being illuminated by a color composition corresponding to the green level that it receives, to the red level corresponding to half the sum of the luminance levels received on the red pixels P22 and P33 that symmetrically flank it, and to the blue level corresponding to half the sum of the luminance levels received by the blue pixels P24 and P32 that symmetrically flank it. This interpolation provides colored elements with transitions that are particularly well smoothed, reducing the phenomenon of color moirés in the case of strong color variations in the image.

Compared with known prior organizations, the organization of this matrix makes it possible:
  to increase the sensitivity of the sensor for a given resolution and for a given region of the matrix;
  to increase the resolution for a given sensitivity (that is to say for a given pixel region); and
  to read the matrix more rapidly, for a given resolution and a given sensitivity, and therefore to have a shorter time delay before a new picture is taken.

The invention claimed is:

1. An image sensor comprising a matrix of photosensitive elements, with, in the region where each row and each column of the matrix cross, a pixel comprising:
  a photosensitive region (N1) of n-type conductivity, capable of storing photosensitive charges for an exposure time;
  an n-type storage region (N2) capable of receiving and temporarily storing the charges from the photosensitive region;
  a first transfer gate (G1) for selectively preventing or authorizing a transfer of charges from the photosensitive region (N1) to the storage region (N2);
  a second transfer gate (G2) for selectively preventing or authorizing a transfer of charges from the photosensitive region (N1) to a supply conductor (Vdd) common to the entire matrix;
  a third transfer gate (G3) for selectively preventing or authorizing a transfer of charges between the storage region (N2) and the supply conductor (Vdd);
  a first follower MOS transistor (T4) having its drain connected to the supply conductor, and its gate formed by a fourth transfer gate (G4), said fourth gate being connected to the storage region (N2) whereby the potential of the source of the first MOS transistor, when this transistor is conducting a current, follows the variations in the potential of the storage region;
  a second MOS transistor (T5) for authorizing a current conduction in the first MOS transistor (T4), the drain of the second transistor being connected to the source of the first transistor, the source of the second transistor being connected to a column conductor (COL) common to all the pixels of one column, and the second transistor having a gate formed by a fifth transfer gate (G5),
  the sensor further including a first row conductor (SEL) connected to the second and fifth transfer gates of all of the pixels of one row, wherein the second transistor is rendered conductive whenever the fifth transfer gate authorizes said transfer of charges from the photosensitive region to said supply conductor, a second row conductor (RESET) connected to the third transfer gate of all the pixels of said row, and a third conductor (TRA) connected to the first transfer gate of all the pixels of the matrix.

2. The image sensor as claimed in claim 1, wherein a threshold voltage for initiating conduction in a channel formed beneath the first transfer gate (G1) is close to zero.

3. The image sensor as claimed in claim 2, wherein the threshold voltage for initiating conduction in the channel formed beneath the second transfer gate (G2) is close to zero.

4. The image sensor as claimed in claim 2, wherein the threshold voltage for initiating conduction in the channel formed beneath the third transfer gate (G3) is close to zero.

5. The image sensor as claimed in claim 2, wherein the matrix of pixels is organized in a staggered fashion, the directions along which the centers of the photosensitive regions of the various pixels lie closest together being the diagonal lines of the matrix.

6. The image sensor as claimed in claim 2, wherein the photosensitive region is an n-doped region formed in a semiconductor substrate in which the pixels are formed, this region being located beneath a grounded p-type region.

7. The image sensor as claimed in claim 2, wherein the threshold voltage for turning on the transistors T4 and T5 is above the threshold voltage for initiating conduction in the channel beneath the gates G1, G2 and G3.

8. The image sensor as claimed in claim 1, wherein a threshold voltage for initiating conduction in a channel formed beneath the second transfer gate (G2) is close to zero.

9. The image sensor as claimed in claim 8, wherein the threshold voltage for initiating conduction in the channel formed beneath the third transfer gate (G3) is close to zero.

10. The image sensor as claimed in claim 8, wherein the photosensitive region is an n-doped region formed in a semiconductor substrate in which the pixels are formed, this region being located beneath a grounded p-type region.

11. The image sensor as claimed in claim 8, wherein the matrix of pixels is organized in a staggered fashion, the directions along which the centers of the photosensitive regions of the various pixels lie closest together being the diagonal lines of the matrix.

12. The image sensor as claimed in claim 8, wherein the threshold voltage for turning on the transistors T4 and T5 is above the threshold voltage for initiating conduction in the channel beneath the gates G1, G2 and G3.

13. The image sensor as claimed in claim 1, wherein a threshold voltage for initiating conduction in a channel formed beneath the third transfer gate (G3) is close to zero.

14. The image sensor as claimed in claim 13, wherein the threshold voltage for turning on the transistors T4 and T5 is above the threshold voltage for initiating conduction in the channel beneath the gates G1, G2 and G3.

15. The image sensor as claimed in claim 13, wherein the photosensitive region is an n-doped region formed in a semiconductor substrate in which the pixels are formed, this region being located beneath a grounded p-type region.

16. The image sensor as claimed in claim 13, wherein the matrix of pixels is organized in a staggered fashion, the directions along which the centers of the photosensitive regions of the various pixels lie closest together being the diagonal lines of the matrix.

17. The image sensor as claimed in claim 1, wherein a threshold voltage for turning on the transistors T4 and T5 is above the threshold voltage for initiating conduction in a channel beneath the gates G1, G2 and G3.

18. The image sensor as claimed in claim 17, wherein the photosensitive region is an n-doped region formed in a semiconductor substrate in which the pixels are formed, this region being located beneath a grounded p-type region.

19. The image sensor as claimed in claim 1, wherein the photosensitive region is an n-doped region formed in a semiconductor substrate in which the pixels are formed, this region being located beneath a grounded p-type region.

20. The image sensor as claimed in claim 1, wherein the matrix of pixels is organized in a staggered fashion, the directions along which the centers of the photosensitive regions of the various pixels lie closest together being the diagonal lines of the matrix.

* * * * *